(12) United States Patent
Mackie et al.

(10) Patent No.: US 8,680,452 B2
(45) Date of Patent: Mar. 25, 2014

(54) OPTICALLY CONTROLLED MOTORIZED CONTROL DEVICE

(75) Inventors: Greg C. Mackie, Kirkland, WA (US); Chuck T. Jensen, Everett, WA (US); Peter F. Watts, Carmarthenshire (GB)

(73) Assignee: QSC Audio Products, LLC, Costa Mesa, CA (US)

( * ) Notice: Subject to any disclaimer, the term of this patent is extended or adjusted under 35 U.S.C. 154(b) by 354 days.

(21) Appl. No.: 12/987,011

(22) Filed: Jan. 7, 2011

(65) Prior Publication Data
US 2011/0168870 A1 Jul. 14, 2011

Related U.S. Application Data

(60) Provisional application No. 61/294,821, filed on Jan. 13, 2010.

(51) Int. Cl.
*G01C 3/08* (2006.01)

(52) U.S. Cl.
USPC .................. 250/206.1; 341/1; 341/5; 341/13

(58) Field of Classification Search
USPC ............. 250/231.13–231.18; 341/1, 5, 13, 14
See application file for complete search history.

(56) References Cited

U.S. PATENT DOCUMENTS

| | | |
|---|---|---|
| 3,820,096 A | 6/1974 | Himmelsbach et al. |
| 4,412,182 A | 10/1983 | Yochum |
| 4,559,448 A * | 12/1985 | Rozsa ...................... 250/231.14 |
| 5,719,570 A * | 2/1998 | Breitbarth ........................ 341/13 |
| 5,986,584 A | 11/1999 | Breitbarth |
| 6,813,361 B1 | 11/2004 | Jeffs et al. |
| 7,248,252 B2 * | 7/2007 | Amari et al. .................. 345/184 |
| 7,714,272 B2 * | 5/2010 | Urabe ...................... 250/231.13 |
| 7,825,369 B2 * | 11/2010 | Hane ........................ 250/237 G |

OTHER PUBLICATIONS

Alpha, Motorized Slide Potentiometer, www.taiwanalpha.com, index of product, dated Sep. 17, 2009.
Alps, Motor-driven Mater Slide Potentiometer, www.alps.com, dated Sep. 15, 2009.
Martinson, Joe, Flying Faders: The Untold Story; Martinsound, on Your Existing Console, www.martinsound.com, dated Sep. 17, 2009.
Penny+Giles, PGFM3200 Compact motorised faders, dated Sep. 17, 2009.

* cited by examiner

*Primary Examiner* — Tony Ko
(74) *Attorney, Agent, or Firm* — Perkins Coie LLP

(57) ABSTRACT

Methods and apparatus are provided for a control device and control device operation. In one embodiment a control device includes a slider configured to support a control knob, a rack coupled to the slider and configured to linearly displace the slider. The rack including slots. The control device may further include a drive element configured to displace the rack and position the control knob, and an optical detection module configured to detect position of the control knob based on one or more optical signals detected relative to slots of the rack. According to another embodiment, a control console is provided including control devices.

25 Claims, 12 Drawing Sheets

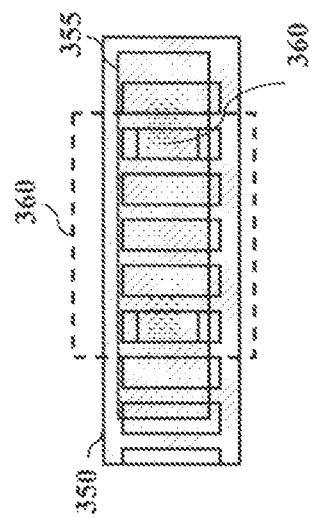
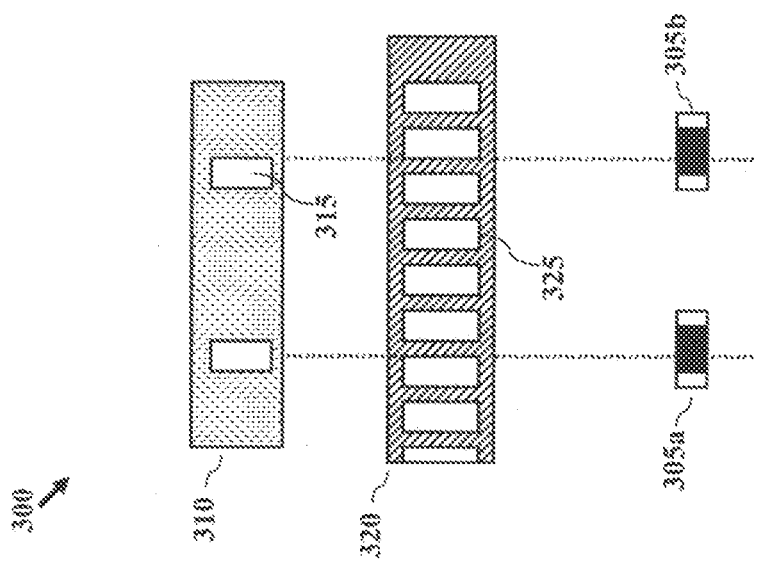
FIG. 3B
FIG. 3A

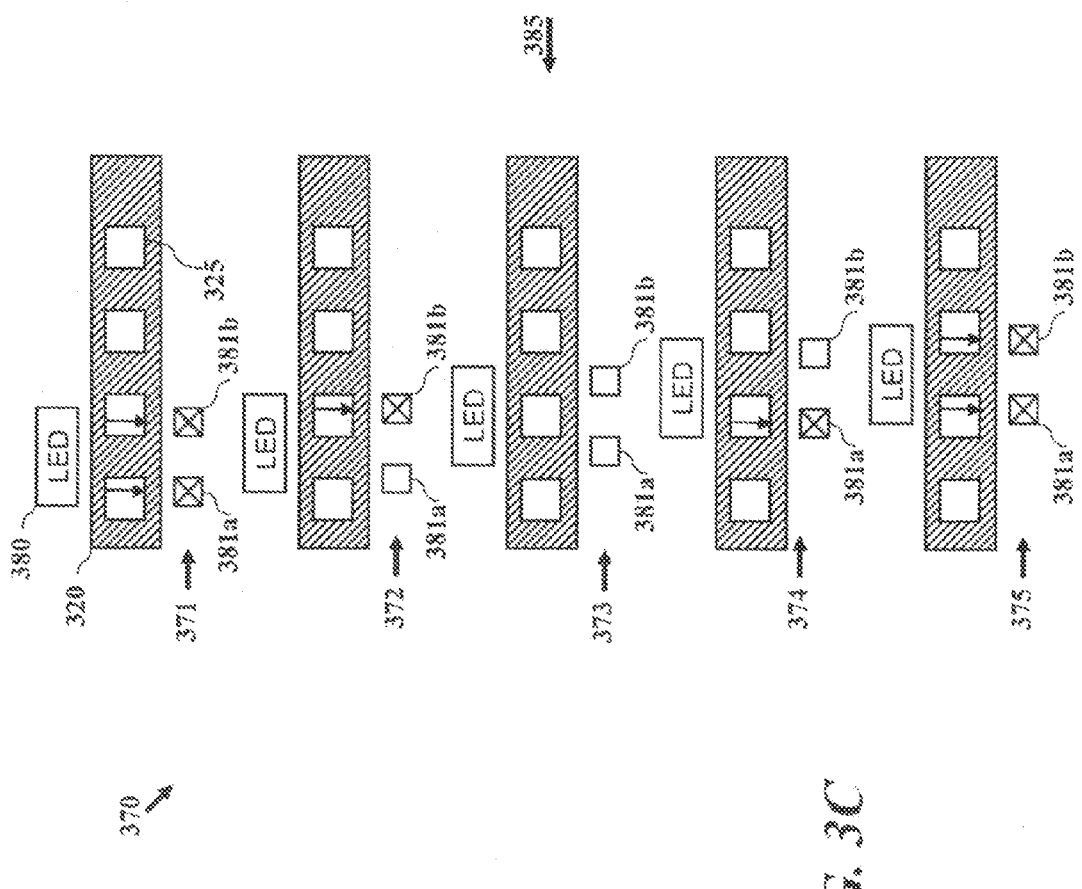

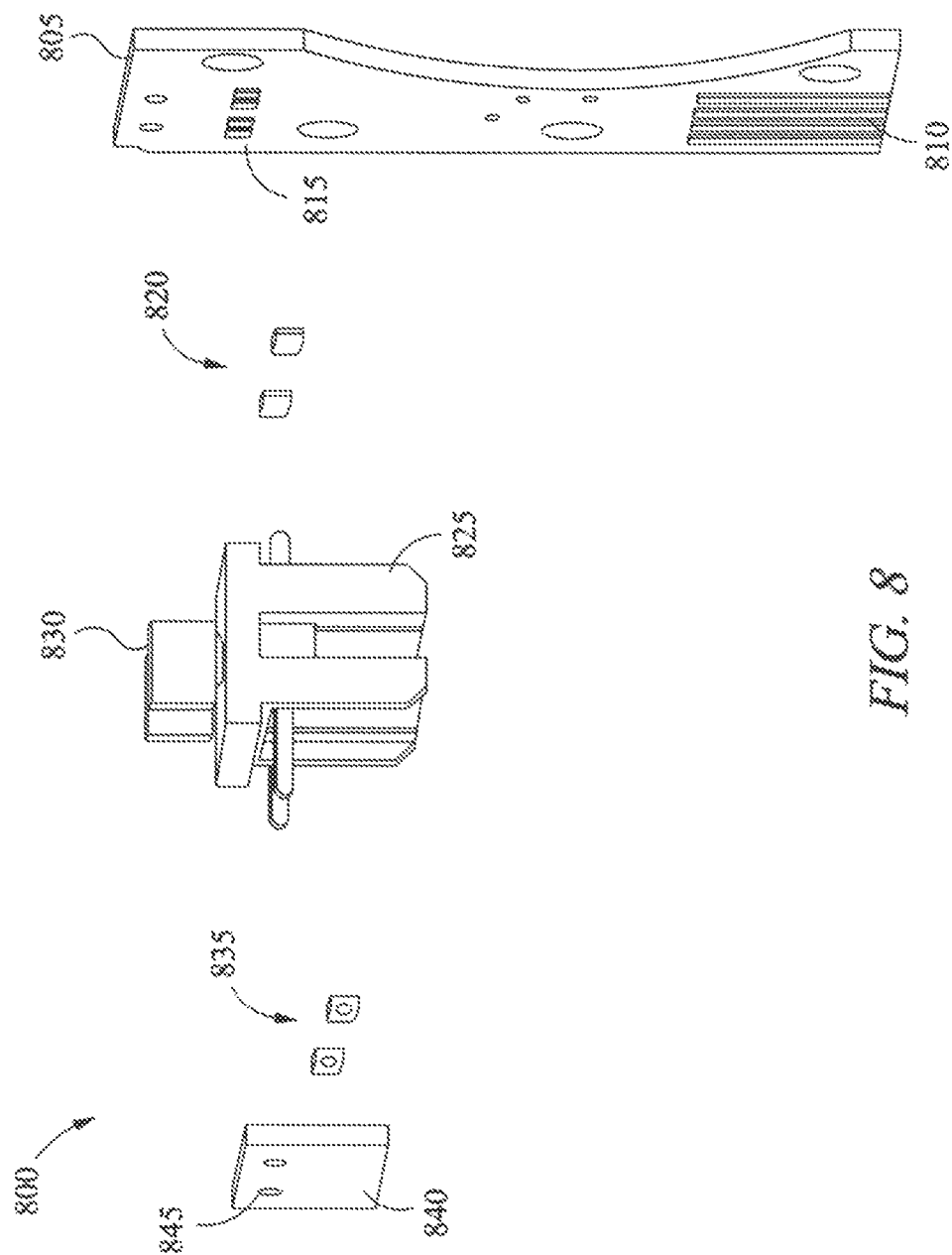

OPTICALLY CONTROLLED MOTORIZED CONTROL DEVICE

CROSS-REFERENCE TO RELATED APPLICATIONS

This application claims priority to U.S. Provisional Application No. 61/294,821 filed Jan. 13, 2010, and entitled "Optically Controlled Motorized Linear Fader," the disclosure of which is hereby incorporated by reference in its entirety.

FIELD

The embodiments described herein relate generally to a control devices and more particularly to an apparatus and method for optical detection and control of a control device, such as a fader.

BACKGROUND

Conventional audio mixing consoles typically employ a plurality of slide controls, commonly referred to as faders, to control the audio level of one or more signal channels. The position of a control knob of the fader generally controls an output, which is typically an electrical signal. Conventional faders typically employ a carbon track to detect the position of the control knob. A conventional mixer may employ faders which are user controlled (e.g., non-motorized) or automatically controlled (e.g., motorized faders). Motorized faders may be controlled by providing an electric drive signal to a motor to adjust the position of a control knob. Similar to non-motorized faders, these faders may additionally be positioned by a user.

A drawback of conventional carbon track potentiometer faders is the limited operating life of these faders due to contamination of the carbon tracks. The carbon tracks may be contaminated by all types of debris, such as dust, liquid, etc. Debris typically enters through the control slot of the fader. As a result, mechanical operating life of these conventional control devices may be greatly reduced. Further, typical carbon track faders are rated as having a lifespan of 10,000 cycles if the carbon track does not become contaminated.

One attempted solution to avoiding contamination of carbon track fader designs is to rotate the body of the fader so that dust and/or other contaminating debris do not fall directly on a carbon track. Another approach is to employ conductive plastic tracks which may be more resilient to debris in comparison to carbon track faders. However, these designs are either expensive, as in the example of conductive plastic track designs, and/or can limit the mechanical "feel" (e.g., stability, side-to-side wobble, etc.) associated with the fader control knob. The feel and/or ease of operation of a fader may directly define the overall quality of an audio mixer to a buyer or user. Consumer success of audio consoles may be based, at least in part, on perceived quality associated with the mechanical feel of the faders. Accordingly, it is desired to provide a fader with extended operating life that does not diminish the "feel" of the fader over time and with use.

Another drawback of conventional faders relates to the design of motorized drive systems. For example, micro drive belt and tuner cord controlled devices used by conventional motorized faders may limit the operating life of a fader. With use over time, these drive mechanisms may fail and/or require maintenance.

Therefore, what is needed is an improved control device design which overcomes one or more drawbacks of conventional fader designs.

SUMMARY OF THE EMBODIMENTS

A method and apparatus for a control device are disclosed and claimed herein. In one embodiment, a control device includes a slider configured to support a control knob, and a rack coupled to the slider, the rack comprising a plurality of slots and configured linearly displace the slider. The control device further includes a drive element configured to displace the rack and control position of the control knob, and an optical detection module configured to detect position of the control knob based on one or more optical signals detected relative to slots of the rack.

According to another embodiment a control console is provided including a plurality of control devices, a memory, and a processor. The processor may be coupled to the plurality of control devices and memory. The processor may be configured to output one or more signals to one or more control devices. Each control device includes a slider configured support a control knob, and a rack coupled to the slider, the rack comprising a plurality of slots and configured linearly displace the slider. Each control device further includes a drive element configured to displace the rack and control position of the control knob, and an optical detection module configured to detect position of the control knob based on one or more optical signals detected relative to slots of the rack.

Further aspects, objects, desirable features, and advantages of the apparatus and methods disclosed herein will be better understood and apparent to one skilled in the relevant art in view of the detailed description and drawings that follow, in which various embodiments are illustrated by way of example. It is to be expressly understood, however, that the drawings are for the purpose of illustration only and are not intended as a definition of the limits of the claimed embodiments.

BRIEF DESCRIPTION OF THE DRAWINGS

FIGS. 3A-3C depict graphical representations of optical position sensing according to one or more embodiments;

FIG. 8 depicts a graphical representation of optical detection elements according to one or more embodiments;

DETAILED DESCRIPTION OF THE EXEMPLARY EMBODIMENTS

Figure 1A:
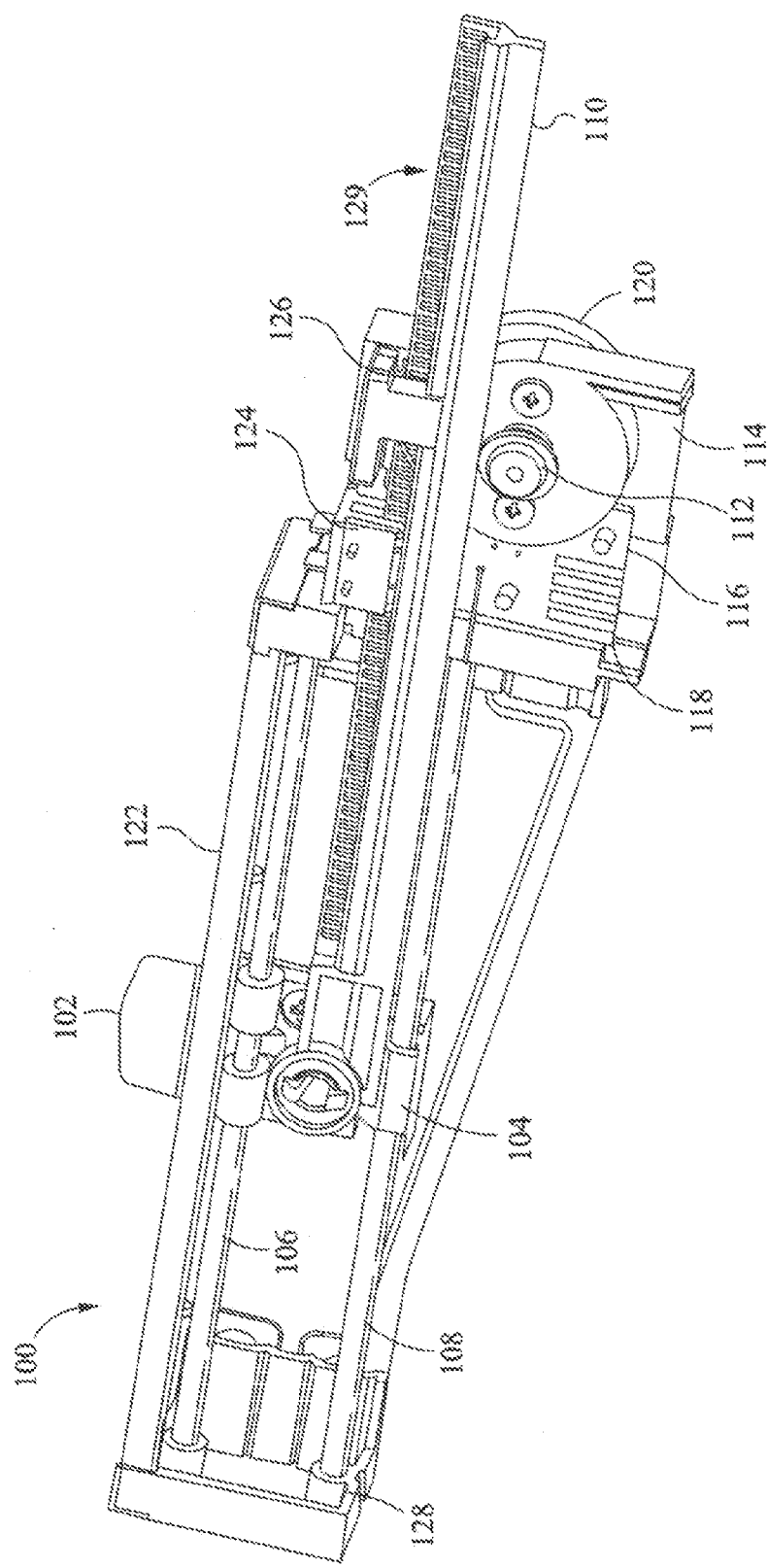
FIG. 1A depicts a control device according to one or more embodiments.

One aspect of the embodiments described herein relates to a control devices commonly referred to as faders, such as linear controls or slide controls. In one embodiment, a control device is provided to include one or more elements for optically sensing positioning and displacement of a control knob associated with the control device. The optical detection elements may be configured to sense position of the control knob based on displacement of a rack element relative to one or more optical detection elements. The optical detection elements may allow for accurate and repeatable detection of control knob position. As used herein, a control device may be referred to as a fader. It should also be understood that a control device as described in herein is not limited to functioning as a fader. As such, output of a control device may not be limited to a range of values from 0% to 100% based on control device position.

In contrast to conventional fader and control devices, control devices described herein may have operational use with no mechanical wear or degradation and can easily exceed one million cycles before failure. As such, the control devices described herein can greatly exceed operation characteristics of conventional fader devices. The control devices may include a drive system for positioning a control knob. In one embodiment, a rack may position a control knob of the control device based on wheel drive element, such as a rubber wheel in contact with the rack. The control device may include a slider configured to support a control knob, wherein position of the slider may be detected based on displacement of the rack. The control knob may include a contact tab configured to detect user touch. The control device may be configured to initiate and/or terminate the drive system based on user contact of the contact tab to provide a touch sense of the control device. In another embodiment, the control device may include a rack and pinion drive system for motorized control of a control knob. The drive system provided herein may provide a level of feel that is improved relative to conventional fader designs.

In another embodiment, a control console is provided to include a plurality of control devices. According to another aspect of the embodiments described herein, a process may be provided for detecting position of one or more control devices and controlling one or more drive systems for controlling position of control knobs singularly and in combination.

As used herein, the terms "a" or "an" shall mean one or more than one. The term "plurality" shall mean two or more than two. The term "another" is defined as a second or more. The terms "including" and/or "having" are open ended (e.g. comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described below with reference to operations that are performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiment are essentially the code segments to perform the necessary tasks. The code segments can be stored in a processor readable medium, which may include any medium that can store or transfer information. Examples of the processor readable mediums include an electronic circuit, a semiconductor memory device, a read-only memory (ROM), a flash memory or other non-volatile memory, a floppy diskette, a CD-ROM, an optical disk, a hard disk, a fiber optic medium, a radio frequency (RF) link, etc.

Figure 1B:
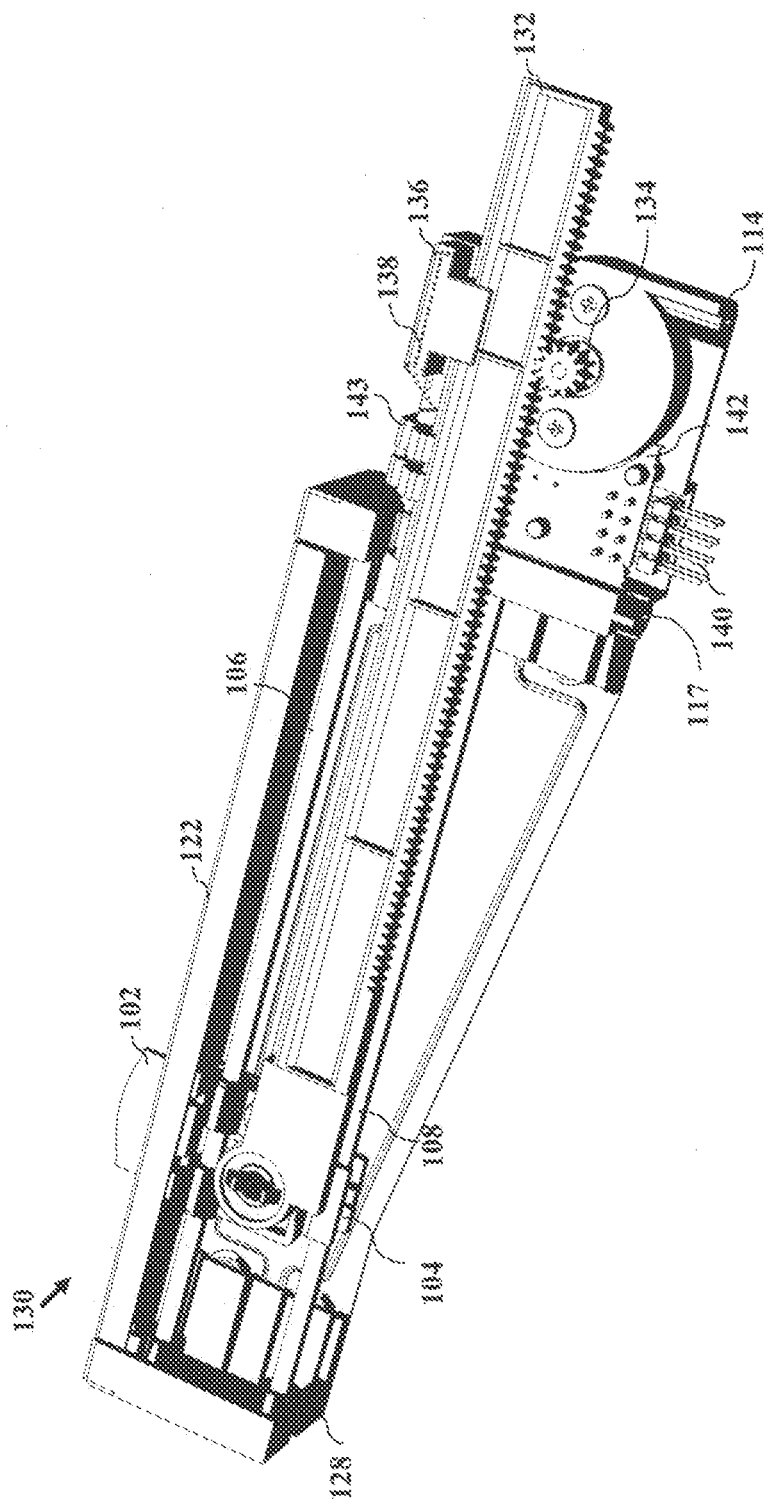
FIG. 1B depicts a control device according to one or more embodiments.
Figure 1C:
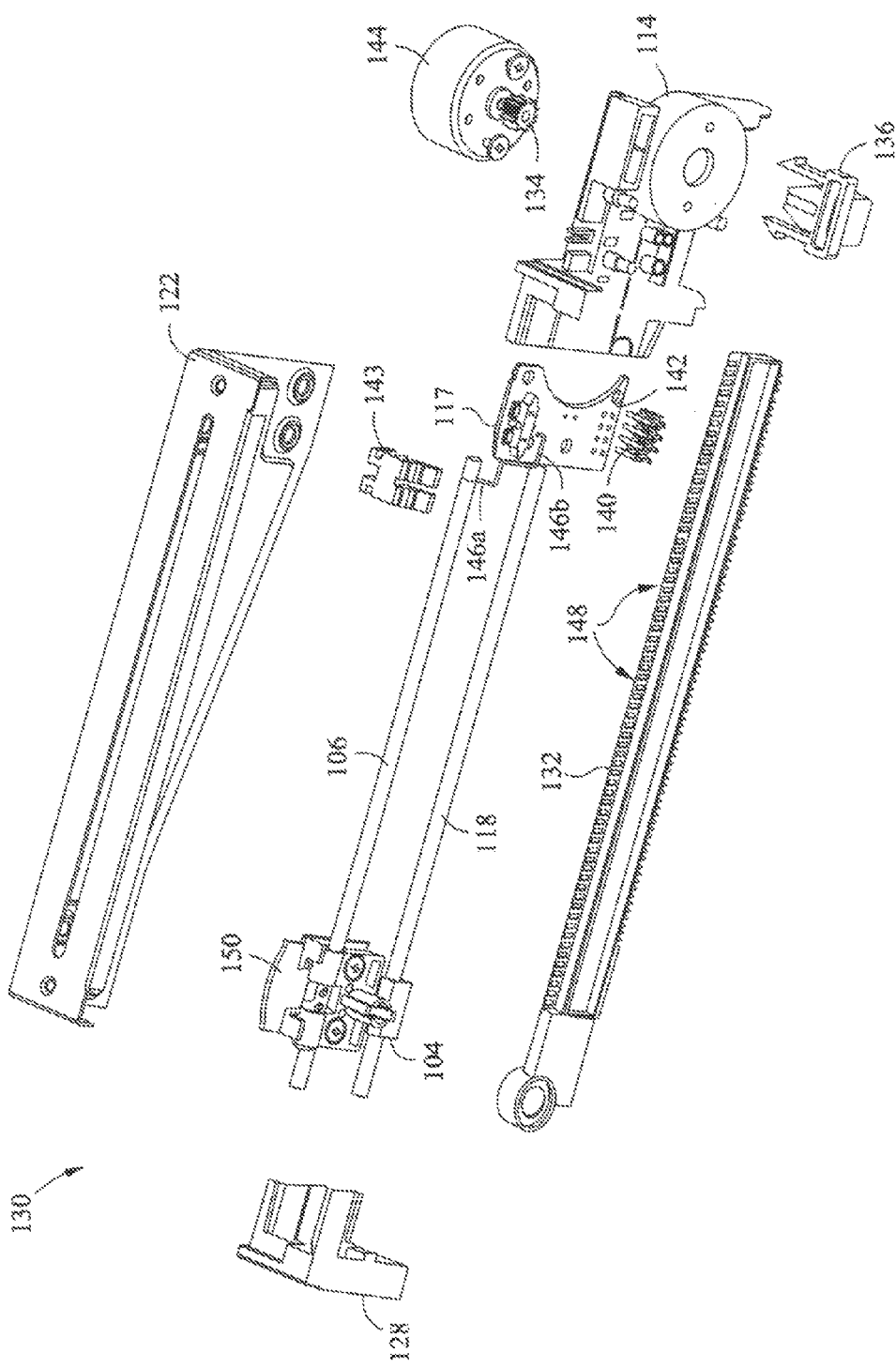
FIG. 1C depicts a disassembled view of the control device of FIG. 1B according to one or more embodiments.

Referring now to the figures, FIGS. 1A-1C illustrate a control device, referred to as a fader, according to one or more embodiments. Referring first to FIG. 1A, a graphical representation of fader 100 is depicted according to one embodiment. Fader 100 may relate to an optically controlled linear control device according to one or more embodiments. As depicted in FIG. 1A, fader 100 includes control knob 102 for user control. The position of control knob 102 may correspond to a desired gain and/or level of a signal controlled by fader 100. For example, position of the fader may relate to values to provide a range associated with 0% to 100% and/or different values. According to one embodiment, fader 100 may be configured to optically detect the position of control knob 102. Further, fader 100 may allow for user or motorized positioning of control knob 102.

Control knob 102 may be supported by a metal tab (not shown in FIG. 1A) coupled to slider 104. Slider 104 may be configured to linear displace control knob 102 along rods 106 and 108. In one embodiment, slider 104 may be a plastic slider. Rods 106 and 108 may be comprised of steel or another conductive material. As shown, rods 106 and 108 may be substantially parallel to allow for positioning of slider 104. According to another embodiment, fader 100 may alternatively employ a C-chassis to allow for displacement of slider 104 as discussed below with respect to FIGS. 2A-2C.

Control knob 102 of fader 100 may be configured to detect user touch in order to provide touch sense. In one embodiment, slider 104 may include a conductive wiper to provide conductivity through rods 106 and 108 to circuit board 116. User activation, or touch, of control knob 102 may be detected based on contact with a contact tab of control knob 102 as will be discussed in more detail below with respect to FIG. 7. In one embodiment, based on user contact with control knob 102, the wiper may electrically couple the contact tab to a control circuit of fader 100. One or more signals provided by the conductive wiper of slider 104 may be employed to provide touch sense. In that fashion, fader 100 can detect user control of control knob 102 to adjust and/or cease motorized operation of one or more faders. Touch sense of fader 100 may similarly allow for detection of a switch circuit (not shown) that may be included in control knob 102 to detect user touch or proximity to the knob according to another embodiment.

Slider 104 may be coupled to rack 110. Rack 110 may comprise a plurality of slots and be configured to linear displace slider 104. Slots of rack 110 may be equally sized and employed with phototransistors of the optical detection module to provide a linear encoder based on displacement of the rack. Fader 100 may additionally include a snap tab configured to support rack 110 to drive element 112. As will be discussed in more detail below with respect to FIG. 9, fader 100 may include spring 126 to provide contact pressure between the drive system and rack 110.

Rack 110 may be positioned by a drive system comprising drive element 112 and drive motor 120. Drive element 112 may be configured to displace the rack and control position of control knob 102. Drive element 112 may be coupled to motor 120 and relates to a drive wheel as depicted in FIG. 1A in contact with rack 110. Drive element 112 may also be configured to control position of control knob 102 based on one or more control signals received from a control unit. The drive system of FIG. 1A includes a rubber wheel as drive element 112 coupled to motor 120 and configured to engage rack 110. The bottom of rack 110 may be smooth to engage the rubber wheel and/or other types of drive wheels. Additionally, the drive system allows for user positioning of the control knob.

Fader 100 includes motor mount module 114 to support the drive system and motor 120. As shown in FIG. 1A, motor mount module 114 may additionally support circuit board 116 and may be coupled to slotted structure 122. According to one embodiment, motor mount module 114 and slotted structure 122 may be configured to support one or more components of fader 100. Support structure 128 may be coupled to slotted structure 122 and may be configured to support rods 106 and 108. Rods 106 and 108 may additionally be supported by, and electrically insulated from, motor mount module 114.

According to one embodiment, fader 100 may include an optical detection module to detect the position of control knob 102 and displacement of rack 110. The optical detection module may be configured to detect the position of control knob 102 based on one or more optical signals detected relative to slots of rack 110 depicted as 129. In particular, circuit board 116 and circuit board 124 may include one or more elements to optically detect displacement of rack 110. Optical detection of fader movement and/or linear displacement of rack 110 may be employed for motorized control and control of one or more channels. In certain embodiments control signals for positioning of control knob 102 may be received by terminals 118 of circuit board 116. Similarly, a detected position of control knob 102 may be output via terminals 118.

Optical detection of rack displacement may be based on light detected relative to movement of one or more slots 129 of rack 110 relative to circuit boards 116 and 124. Slots 129 may relate to a row of windows which may be used to optically detect the position and/or displacement of rack 110. As will be discussed in more detail below with respect to FIG. 8, circuit board 116 may include one or more LED's and photodetectors (e.g., phototransistors) in a directly-facing arrangement relative to each other. The optical detection module may include at least one light source and at least two photodetectors. In another embodiment, the optical detection module includes first circuit board 116 configured to support a light source for detecting position of rack 110 and second circuit board 124 configured to support and receive one or more signals from at least two light detection sensors. Circuit boards 116 and 124 may be arranged on opposite sides of rack 110 and configured to electrically communicate.

Circuitry of fader 100 may be configured to detect positioning of control knob 102 and/or user touch of contact tab of control knob 102. The circuitry may be mounted to one or more of circuit boards 116 and 124 and may include one or more components. Terminals 118 may be coupled to a processor or controller of an control device (e.g., control console, control module, audio device, etc.) to output and/or receive one or more signals. The circuitry of circuit boards 116 and 124 may additionally be configured to output drive signals to motor 120. When a user touches a control knob 102, the circuitry may temporarily disable motorized control of rack 110. Based on user positioning of control knob 102, fader circuitry may detect and/or store the position of the control knob. Terminals 118 of circuit board 116 are depicted as a plurality of conductive terminals according to one embodiment. It should also be appreciated that terminals 118 can relate to printed circuit board (PCB) edge card fingers.

Fader 100 may be configured to detect the position of control knob 102. Circuitry of the fader may be configured to detect position accuracy within increments of 0.5 mm according to one embodiment. It should also be appreciated that smaller increments of position accuracy may be employed. For example, intermediate states where photodetectors are not completely on or off can be measured to provide a higher resolution in between hard on and off states. Similarly, by employing analog inputs, the resolution may be increased to 0.25 mm, or even 0.125 mm in certain embodiments.

Referring now to FIG. 1B, a graphical representation is depicted of a fader according to another embodiment. Fader 130 relates to control device including gear rack 132 configured to interface with pinion gear 134. Gear rack 132 may be positioned by drive elements including pinion gear 134 and a drive motor (shown as 144 in FIG. 1C). According to another embodiment, gear rack 132 may provide a row of windows which may be used to optically detect the position of control knob 102 as will be discussed in more detail below with respect to FIGS. 3A-3C.

Fader 130 may include snap tab 136 coupled to support gear rack 132 to motor mount module 114. Fader 130 may additionally include spring clip 138 to provide constant contact pressure between pinion gear 134 and gear rack 132. Spring clip 138 relates to a wire spring configured to snap to snap tab 136 in order to provide proper contact pressure between pinion gear 134 and gear rack 132. In that fashion, spring clip 138 may correct for possible manufacturing inconsistencies for one or more components of fader 130 and increase the operational life of gear rack 132 and pinion gear 134.

Fader 130 includes circuitry 117 configured to detect positioning of control knob 102. Pins 140 of circuitry 117 may be coupled to a processor or controller of an audio control device to output and/or receive one or more signals. Circuitry 117 may additionally be coupled to a drive motor of fader 130. Signals received by pins 140 may control operation of the drive motor to position gear rack 132.

Referring now to FIG. 1C, a semi-disassembled view is shown of fader 130 of FIG. 1B. As shown in FIG. 1C, fader 130 includes drive motor 144. As further shown, rods 106 and 108 may be electrically coupled to circuitry 117 via wires 146a and 146b. Tab 150 is coupled to slider 104 and may be configured to support control knob 102 (not shown in FIG. 1C). In that fashion, contact of control knob 102 by a user may activate a conductive wiper of slider 104 to provide conductivity through rods 106 and 108 to circuit board 142 in order to provide a "touch sense." Touch sense may relate to detecting user touch and modifying one or more signal paths based on user operation of a control knob or control knob during the user touch or contact. Touch sense may further allow for disabling one or more drive elements associated with a control knob during user contact of the control knob and optical detection of the user positioning.

In one embodiment, circuitry 117 can include optical sensors and/or optical infrared (IR) light emitting diodes (LEDs). Light that is emitted from the LEDs may be directed through prism 143 to be redirected through gear rack 132 to a sensor window with openings above phototransistors. In certain embodiments, prism 143 may be coupled to circuit board 142 of circuitry 117. Light directed through prism 143 may be redirected through windows, shown as 148, of gear rack 132. In that fashion gear rack 132 may be employed for optical detection of displacement and positioning of control knob 102 and/or slider 104. The one or more windows depicted as 148 may relate to a plurality of windows provided by gear rack 135. Based on the position of gear rack 132, one or more windows of the gear rack may straddle phototransistors of circuitry 117. Accordingly, the positioning of gear rack 132 may be determined by sensing position using one or more pulses that may be electrically translated by circuitry 118. According to another embodiment, the position of gear rack 132 may be determined during motorized operation and/or during user control of control knob 102.

Figure 2B:
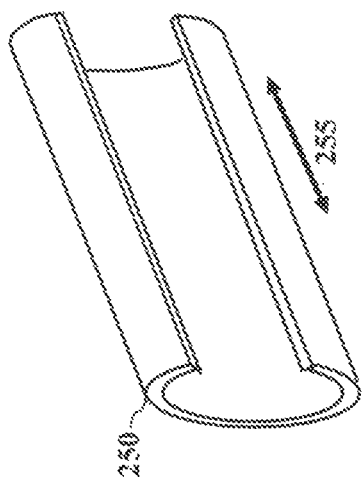
FIGS. 2A-2C depict graphical representations of chassis guide members according to one or more embodiments.
Figure 2C:
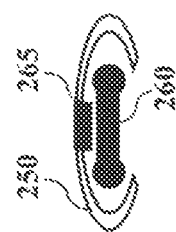
Figure 2A:
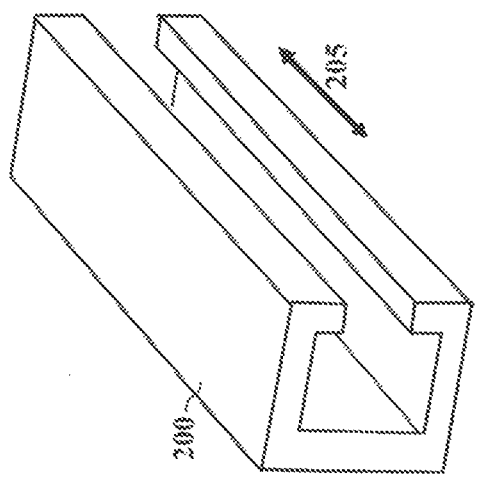

Referring now to FIGS. 2A-2C, graphical representations of chassis guide members are depicted according to one or more embodiments. In certain embodiments, the faders of FIGS. 1A-C may employ a chassis guide member instead of rods (e.g., rods 106 and 108) to guide positioning of a slider (e.g., slider 104). Referring first to FIG. 2A, a C-chassis is depicted according to one embodiment. C-chassis 200 may be employed by a fader to allow for positioning of a slider within C-chassis 200 as shown by 205. C-chassis 200 may be comprised of steel or another conductive material. A conductive wiper of the slider may conduct through C-chassis 200 to a circuit board of the fader to provide touch sense signals in certain embodiments.

Referring now to FIG. 2B, a C-chassis is depicted according to another embodiment. Round C-chassis 250 relates to a guide member with a curved shape to allow for positioning of a slider as shown by direction 255. In FIG. 2C, slider 260 and round C-chassis 250 are shown according to another embodiment. Slider 260 (e.g., slider 104) may be a plastic slider including wiper 265 to provide touch sense as described herein.

Referring now to FIGS. 3A-3C, graphical representations are depicted of optical position sensing according to one or more embodiments. Referring first to FIG. 3A, a disassembled view is depicted of elements of optical sensor 300. According to one embodiment, optical sensor 300 includes phototransistors 305a-305b, sensor window 310 and slide rail encoder 320. Slide rail encoder 320 may be attached to, or part of, a rack (e.g., rack 110, gear rack 132). Optical sensor 300 may be configured to detect light emitted from LEDs associated with displacement of a fader control knob (e.g., control knob 102).

In one embodiment, light emitted from the LEDs may be directed from a prism through windows of a gear rack (e.g., gear rack 125). As will be discussed in more detail below with respect to FIG. 10, two circuit boards may be employed instead of a prism to optically detect rack displacement and position. In one embodiment, optical sensor 300 includes two phototransistors 305a-305b to detect the LED light redirected through a rack. It should also be appreciated that additional phototransistors may be employed in certain embodiments.

Phototransistors 305a-305b may be configured to detect LED light received via one or more openings, shown as 350, of slide rail encoder 320. Phototransistors 305a-305b may be included in circuitry of the fader. Slide rail encoder 320 may overlay phototransistors 305a-305b to provide a path for LED light from circuit board 310 including light source 315. Based on positioning of a control knob of a fader, slide rail encoder 320 may be displaced with respect to circuit board 310. Phototransistors 305a-305b may be configured to detect displacement based on light received via windows 325 of slide rail encoder 320. Optical position detection will be discussed in more detail below with respect to FIG. 3C. Slide rail encoder 320 may relate to windows of a rack and may straddle phototransistors 305a-305b.

Referring now to FIG. 3B, a graphical representation is shown of the slide rail encoder 350 of the optical sensor overlaying the light source. The optical sensor may detect light received via windows in slide rail encoder 350 and sensor window 310, shown as 355. As such, optical position sensor 350 can detect light directed by a prism, or circuit board, for a minimum footprint shown as 360. In that fashion, the optical sensor may detect the positioning of the gear rack using one or more pulses that may be electrically translated by circuitry during motorized operation and/or during user control.

Referring now to FIG. 3C, a graphical representation is depicted of operation of the optical sensor of FIG. 3A. Graphical representations 370 depict four states in which light passes through windows or slots of a rack to phototransistors of the optical sensor. The optical sensor states, associated with positions shown as 371-375, allow for detection of rack displacement (and control knob position) in each direction. Each position of the fader may be associated with one of the states. Slide rail encoder 320 of optical sensor 300 includes a plurality of windows 325 for light emitted by LED 380 to pass. Based on the position of slide rail encoder 320, phototransistors 381a-381b (e.g., phototransistors 305a-305b) may or may not detect the LED light. In one embodiment, LED 380 may relate to a single LED. In other embodiments, LED 380 may relate to a plurality of LEDs, such as LED pair of FIG. 8.

States 371 and 375 may relate to states of the control knob wherein LED light can be detected by each of the phototransistors 381a-381b. As the rack is displaced, shown by direction 385 with respect to LED 380 and phototransistors 381a-381b, windows 325 may block one or more of the phototransistors 381a-381b. For example, in position 372 phototransistor 381a is blocked, while phototransistor 381b may receive light emitted by LED 380 due to the position of slide rail 320. State 373 depicts blockage of each phototransistor. State 374 depicts detection by phototransistor 381a and blockage of phototransistor 381b as the rack is subsequently displaced in direction 385. Output of each of phototransistors 381a-381b may be detected and monitored by circuitry of the fader (e.g., circuitry 118) to determine position of the control knob. Further, a current position of the control knob may be stored in memory by one or more of a mixer and control console. Stored position may be used to determine subsequent positioning by a user and/or motorized positioning.

Figure 4:
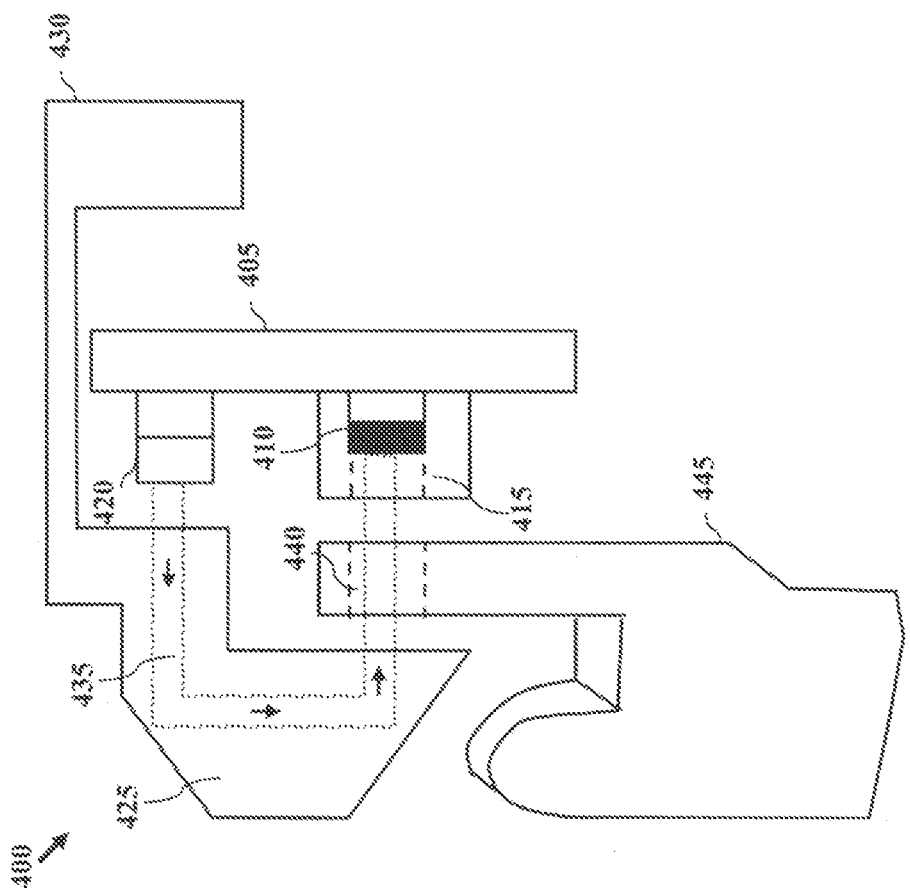
FIG. 4 depicts a simplified diagram of an optical detection system according to one or more embodiments.

Referring now to FIG. 4, a simplified diagram is depicted of an optical detection system according to one embodiment. Optical detection system 400 includes circuit board 405 which includes phototransistors 410 (e.g., phototransistors 305a-305b) and light blocker 415 (e.g., sensor window 310). Circuit board 405 may additionally include light source 420 (e.g., LED 380) configured to emit light, shown as 435, via prism 425 of coupler 430 (e.g., coupler 160). As depicted in FIG. 4, prism 425 is configured to direct light 435 to phototransistors 410 based on the position of rack 445. Openings of rack 445, shown as 440, can allow light to be detected by phototransistors 410. As will be discussed below with reference to FIG. 8, an optical detection system may employ an additional circuit board to detect light emitted by circuit board 405.

Figure 5:
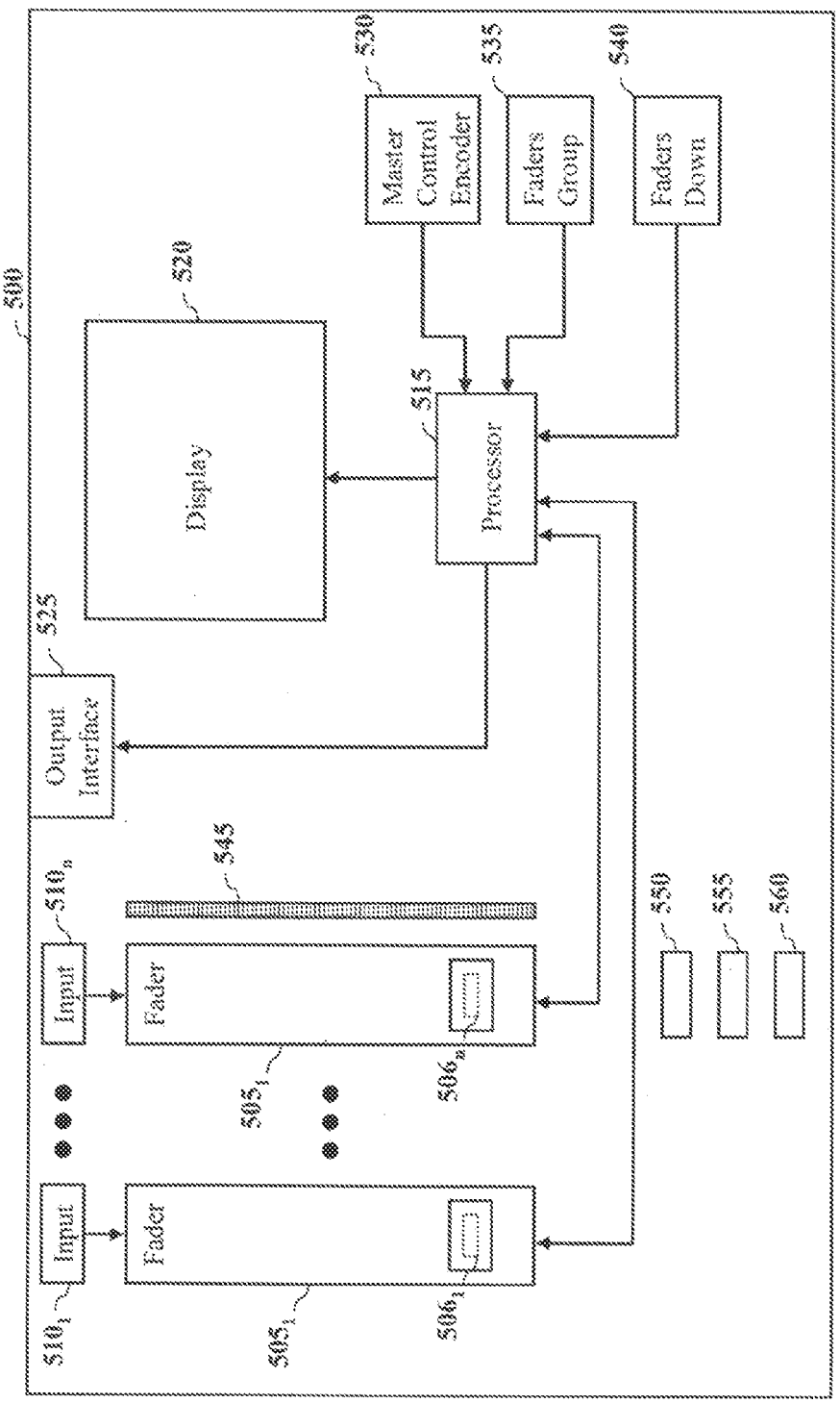
FIG. 5 depicts a simplified block diagram of a control console employing a fader according to one or more embodiments.

Referring now to FIG. 5, a simplified block diagram is depicted of a control console which employs a fader according to one or more embodiments. Control console 500 may relate to an audio control device (e.g., a mixer). It should also be appreciated that control console 500 may relate to any type of control device which employs a fader or linear control device in general. As shown, control console 500 can include one or more faders $505_{1-n}$ to control gain or input level of one or more signals received on input terminals $510_{1-n}$. Processor 515 may be configured to process one or more audio signals received by input terminals $510_{1-n}$ based on the position of control knobs and/or sliders of faders $505_{1-n}$. According to one embodiment, each of faders $505_{1-n}$ may be configured to optically detect the position of a control knob and further may be configured to adjust the position of a control knob based on one or more signals received by processor 515.

According to another embodiment, data processed by processor 515 related to input data received by input terminals $510_{1-n}$ and/or data associated with positioning of faders $505_{1-n}$ may be output by output interface 525. It may also be appreciated that display 520 may be configured to display data based on data received and/or position of faders $505_{1-n}$. According to another embodiment, display 520 may be configured to display the position and/or user inputs for control of faders $505_{1-n}$.

Faders $505_{1-n}$ may each be configured to provide touch sense. For example, each fader may be configured to include a touch sensitive contact tab. In contrast to conventional consoles, touch sense as used herein may be based on user touch of metal tabs or sensor of the control knob of the fader. As shown in FIG. 5, contact tabs $506_{1-n}$ relate to exposed metal tabs at which may be positioned on each fader control knob. Contact tabs $506_{1-n}$ may be coupled to circuitry of the fader via a wire and/or coupling. Based on user touch of a fader, specifically a contact tab, control console 500 may be configured to perform one or more functions. In one embodiment, contact tabs $506_{1-n}$ may be located at the center of the fader control knob.

According to one embodiment, the control console 500 may display one or more of a channel number, bank select (e.g., selection of a plurality of faders) and name (if given a name) on display 520 based on user touch of a contact tab. For example, if the channel was named "lead guitar," display 520 would display lead guitar, the channel number and associated bank information. In that fashion, control console 500 may provide automatic identification of the name, title, or use of a particular fader within a channel of the console. The identification may provide the functionality of an electronic write strip for the fader. For effects channels (such as FX return), selected effects may be indicated by display 520 when a fader tab is touched. Alternatively, if no effects have been selected or associated with a fader, display 520 may output a display message such as "no fx." Further, when multiple fader tabs are touched, display 520 may be configured to not display attributes such as name, title or effects associated with the tabs.

Control console 500 may be configured to allow for selection and/or control of one or more faders. Faders group button 535 may be employed by users for selection of a group of faders. For example, a user may select faders group button 535 which may be configured to blink based on a user selection. The user may then select one or more of faders $510_{1-n}$ by selecting a button, or touching a contact tab of a control knob, for each fader to be selected. Based on user selection, each selected button, or an LED associated with the fader, may be configured to blink. A user may then select faders group button 535, at which time each button will stop blinking. To adjust faders within a group, a user can touch the tab, such as tab $506_1$, and move the fader. As such, control console 500 may be configured to adjust each fader associated with the fader group.

According to another embodiment, to adjust only a single fader of a group, a user can adjust the fader without touching the control knob. Control console 500 may additionally be configured to detect simultaneous movement of more than one fader in a group when a user tries to move more than one fader. In some instances control console 500 may suspend group adjustment. According to another embodiment, control console 500 may be configured to provide a reverse audio function wherein all faders may be decreased when a single fader control knob is increased.

Control console 500 may be configured to allow a user to name each fader based on manufacturer supplied names and/or user defined names. In one embodiment, a factory name may be selected by a user touching a fader tab, such as tab $506_1$, and rotating master control encoder 530 to select a stored name. Display 520 may be configured to list factory stored names. A user may then depress master control encoder 530 to select a displayed name. To select a custom name, a user may employ master control encoder 530 to select one or more characters (e.g., alphanumeric) to define a name for one or more faders. In certain embodiments, control console 500 may include an interface for coupling to a keyboard or input device. In that fashion, a user may specify one or more custom names using the keyboard. Control console 500 may additionally store a list of names previously used.

According to another embodiment, control console 500 may be configured to provide a faders down function. By selecting faders down button 540, control console 500 may be configured to position the faders within a single control bank to the lowest position (e.g., an "Off" position). This eliminates the need for the operator to manually move all faders to the lowest position. Faders down button 540 may avoid possible damage to fader controls by users who simultaneously position each of faders $510_{1-n}$. In certain embodiments, faders down button 540 may be triggered after a user presses faders down button 540 for at least a predetermined period of time (e.g., 1-2 seconds) in order to reduce unwanted triggering. Faders down button 540 may relate to one of a hard button and soft button. Control console 500 may employ functionality associated with faders down button 540 to calibrate the position of a control knob.

According to another embodiment, control console 500 may include one or more indicators to aid in adjustment of faders. In certain embodiments, control console 500 may employ non-motorized faders. Accordingly, control console 500 may optionally include an indicator 545 for one or more faders. Indicator 545 may be employed by a user to set a fader control knob to match a scene setting of the console. For example, scene setting may relate to one or more predefined positions for each fader. As such, control console 500 may illuminate one or more LEDs of indicator 545 to assist a user to position a fader. Indicator 550 may indicate that a fader should be lowered, indicator 555 may indicate a correct position and indicator 560 may indicate that the fader should be raised. Console 500 may include indicators 550, 555, and 560 for each fader.

Although use of faders has been described in connection with an audio console in FIG. 5, it should also be appreciated that a fader as described herein may additionally be employed for other equipment. For example, control console 500 may be configured for operation as one or more of a lighting console, audio effects parameter control, audio/video console, controllers for remote positioning/movement of servo controlled equipment, and any device in general which requires one or more positioning controls.

Figure 6:
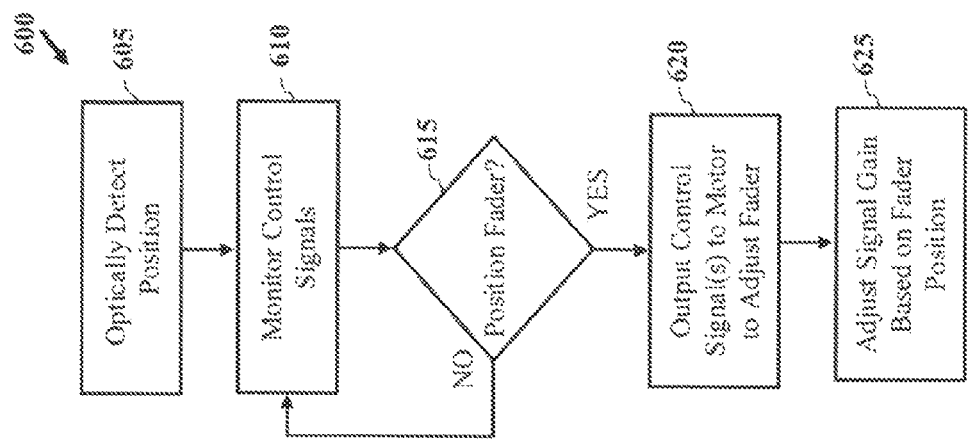
FIG. 6 depicts a process for control of a fader according to one or more embodiments.

Referring now to FIG. 6 a process is depicted which may be performed by circuitry of the fader of FIGS. 1A-1C according to one embodiment. Process 600 may be initiated by optically detecting position of a fader (e.g., fader 100) at block 605. For example, in one embodiment optical sensors of the fader circuitry may be configured to detect light emitted from LEDs directed through a rack of the fader. Based on the position of rack, the position of a control knob of the fader may be detected at block 605. Position of the rack may be determined at block 605 while the control knob of the fader is under motorized control, user control and/or while stationary.

At block 610, circuitry of the fader can monitor control signals for motorized operation. Control signals may be received from a controller (e.g., processor 515) of a control console (e.g., console 500) to control movement of the fader. Alternatively, or in combination, one or more signals generated by the fader, such as user touch of the fader, may be monitored at block 610. Based on one or more signals received at block 610, fader circuitry can determine whether to position a control knob of the fader at decision block 615. When the control knob does not require positioning (e.g., "NO" path out of decision block 615), the fader circuitry may continue to monitor control signals at block 610. When the fader circuitry determines that positioning of the control knob is required (e.g., "YES" path out of decision block 615), the circuitry may output one or more control signals to operate a motor (e.g., drive motor 150) to control fader position at block 620. Process 600 may proceed to adjust signal gain of one or more signals received based on the position of the fader control knob at block 625 before returning to block 605.

Figure 7:
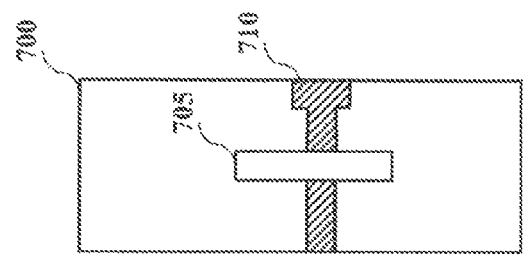
FIG. 7 depicts a graphical representation of an control knob according to one or more embodiments.

Referring now to FIG. 7, a graphical representation is depicted of a control knob according to one or more embodiments. Control knob 700 may be employed by one or more of the faders described herein. Control knob 700 includes contact tab 705. Contact tab 705 may relate to a metal tab enclosed by control knob 700 and electrically coupled to a slider (e.g., slider 104) or circuit board (e.g., circuit board 116). Based on user contact with contact tab 705, circuitry of the fader may detect a user touch. Based on the user touch, the circuitry of the fader may cease motorized control of control knob 700. In certain embodiments, contact tab 705 may relate to a sensor configured to detect a users touch or close proximity to control knob 700. For example, contact tab 705 may relate to one or a capacitive and optical sensor. Control knob 700 further include indicia 710 which may be used to align the control knob with indicia of a control console (e.g., console 500). Indicia 710 may relate to a separately colored portion of the control knob or a marking in general.

Referring now to FIG. 8, a graphical representation is depicted of optical detection elements of a fader according to one or more embodiments. FIG. 8 depicts a dissembled view of one or more elements of the fader of FIG. 1A. In one embodiment, optical detection elements 800 may be employed to detect the position or displacement of a rack (e.g., rack 110) employing the optical detection process discussed above with respect to FIGS. 3A-3C. Optical detection elements 800 include circuit board 805 (e.g. circuit board 116) and circuit board 840. Circuit board 805 includes solder pads 815 which may interface with phototransistors 820. Circuit board 805 additionally includes terminals 810 which may be configured to output one or more signals based on output of phototransistors 820. Light guide 825 may be configured to support circuit board 840 relative to circuit board 805. Light guide 825 may be comprised of an opaque plastic material and may be configured to allow light from LEDs 835 to pass through one or more slots of a rack (e.g., rack 110) for detection by phototransistors 820. Accordingly, light guide 825 includes a slot to allow a rack to freely move between.

Light guide 825 may additionally include conductor pins 830 which may be employed to provide power for the LEDs.

Circuit board 840 may include slots 845 for receiving conductor pins 830. LEDs 835 may be configured to output light based on one or more output signals by circuit board 840. In one embodiment, circuit board 840 may be electrically coupled to circuit board 805 via conductor pins 830. It should also be appreciated that optical detection elements 820 may be employed for one or more embodiments of control devices described herein.

Figure 9:
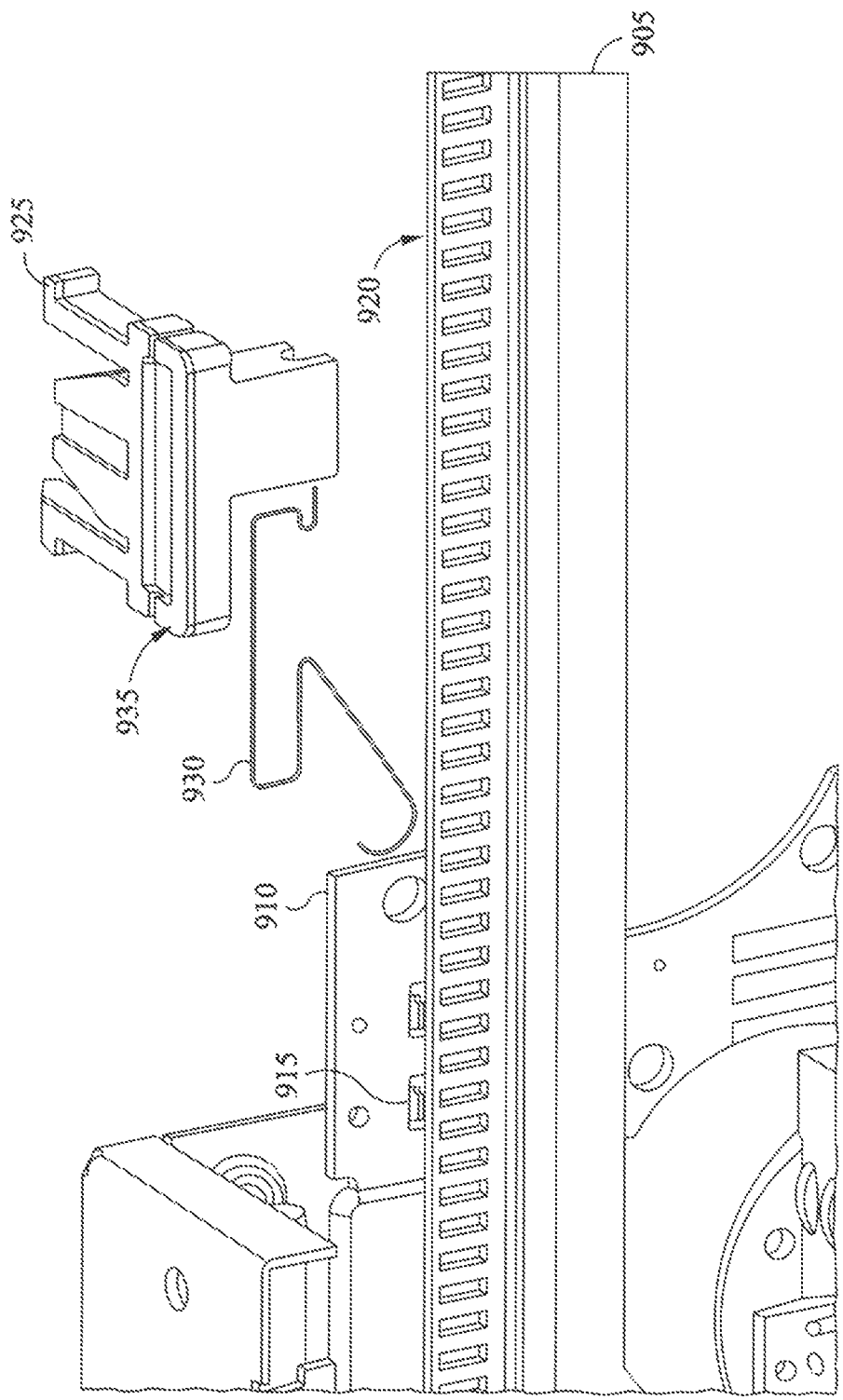
FIG. 9 depicts a graphical representation of fader elements according to one or more embodiments.

Referring now to FIG. 9, a partially disassembled view is depicted of a fader according to one or more embodiments. As depicted in FIG. 9, rack 905 (e.g., rack 110) is depicted relative to circuit board 910 (e.g., circuit board 805). Circuit board 910 may be configured to support phototransistors depicted as 915 according to one embodiment. Phototransistors 915 may be configured to detect light emitted from a second circuit board (e.g., circuit board 840, not shown in FIG. 9) relative to slots 920 of rack 905.

According to one embodiment, tab 925 may be configured for coupling to circuit board 910, or alternatively to a housing of the control device, as a guide for rack 905. One advantageous element of the control device may be spring clip 930 which may be configured to maintain contact of rack 905 to a drive element (e.g., drive element 112). Spring clip 930 (e.g., spring clip 138) may be positioned above tab 925 and within channel 935. In that fashion, an inexpensive solution may be provided for maintaining contact of rack 905 with a drive element and providing needed, but controlled, friction. In addition, spring clip 930 may be configured to apply pressure to rack 905 to allow the rack to easily slide when displaced by a drive element and when displaced due to user positioning of a control knob. Spring clip 930 may relate to a wire spring and may correct for possible manufacturing inconsistencies of one or more components of a control device. Another advantage of spring clip 930 may be an increase in operational life of rack 905 and a drive element.

Figure 10:
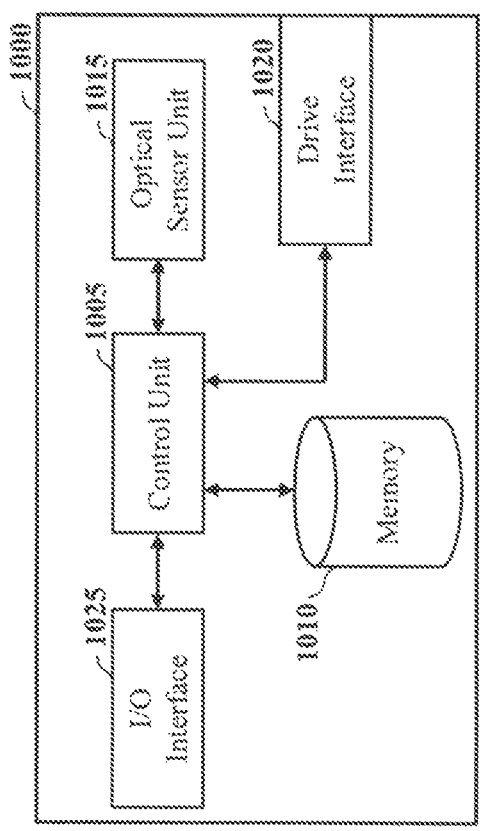
FIG. 10 depicts a simplified block diagram of a fader control unit according to one or more embodiments.

Referring now to FIG. 10, a simplified block diagram of a fader control unit is depicted according to one or more embodiments. In certain embodiments, a fader (e.g., fader 100 or fader 130) may be configured to receive one or more signals for controlling operation and positioning of a control knob. Received control signals by the fader may activate a drive element or motor of the fader. In other embodiments, a fader may include a control module as depicted in FIG. 10. Control module 1000 may be configured to receive one or more control signals from a controller of a console and transmit one or more signals to the controller. In certain embodiments, control module 1000 may be configured to translate one or more received control signals for activating and/or disabling drive elements, and determining position of a control knob.

As depicted in FIG. 10, control module 1000 includes control unit 1005, memory 1010, optical sensor unit 1015, drive interface 1020 and input/output (I/O) interface 1025. Control unit 1005 may be configured to receive and transmit one or more control signals to a processor (e.g., processor 515) of a control board. Operation of control unit 1005 may be based on one or more instructions stored by memory 1010. Optical sensor unit 1015 may relate to one or more elements for optically detecting displacement of a rack (e.g., rack 110) of a control device. Based on one or more signals received from optical sensor unit 1015, control unit 1005 may generate one or more signals to activate or deactivate drive interface 1020. In one embodiment, control unit 1005 may be configured to decode one or more signals detected by optical sensor unit 1015 employing the decoding processes described above with reference to FIGS. 3A-3C. In certain embodiments, control unit 1005 may be configured to determine a base line position or calibrate a position of a control knob during initialization of the fader. Further, during displacement do to user and/or control device drive elements, control unit 1005 may determine a position of the control knob.

Drive interface 1020 may be coupled to a drive element, such as a motor, for positioning a control knob and displacing a rack. I/O interface 1025 may include one or more terminals (e.g., terminals 745) for receiving and/or transmitting control signals to an external control module.

Although the embodiments has been described with reference to preferred embodiments and specific examples, it will be readily appreciated by those skilled in the art that many modifications and adaptations of the motorized linear fader described herein are possible without departure from the spirit and scope of the embodiments as claimed hereinafter. Thus, it is to be clearly understood that this description is made only by way of example and not as a limitation on the scope of the embodiments as claimed below.

What is claimed is:

1. A control device, comprising:
   an electrically conductive linear guide;
   a slider unit having a slider connected to the linear guide, a control knob coupled to the slider, and a contact tab coupled to the control knob, the contact tab being electrically connected to the linear guide, the slider unit being moveable linearly along the linear guide;
   a rack connected at a first portion to the slider unit and being moveable linearly with the slider unit relative to the linear guide to linearly displace the slider unit, the rack comprising a plurality of slots;
   a control unit with a control circuit electrically coupled to the linear guide and configured to receive an electrical signal from the contact tab through the linear guide;
   a drive system with a drive element connected to a second portion of the rack spaced apart from the first portion, the drive element being in a fixed position relative to the linear guide, the drive element being operably coupled to the control circuit and activatable to linearly displace the rack to move the slots and position the control knob relative to the linear guide; and
   an optical detection module in a fixed position relative to the linear guide and spaced apart from the first portion of the rack, the optical detection module being connected to the control unit and configured to detect linear movement of the rack and a position of the control knob based on one or more optical signals detected relative to slots of the rack.

2. The control device of claim 1, wherein the linear guide includes at least one rod supporting the slider for linear displacement along the at least one rod.

3. The control device of claim 1, wherein the control knob includes the contact tab configured to detect user touch.

4. The control device of claim 1, wherein the control knob includes a wiper connected to the linear guide and configured to electrically couple the contact tab to the control circuit through the linear guide based on user contact with the control knob.

5. The control device of claim 1, wherein slots of the rack are equally sized and are employed by the optical detection module to provide a linear encoder based on displacement of the rack.

6. The control device of claim 1, wherein the drive system comprises a motor connected to the drive element in contact with the rack.

7. The control device of claim 1, further comprising a spring clip configured to maintain the drive element in contact with the rack.

8. The control device of claim 1, wherein drive element is configured to control position of the control knob based on one or more control signals received from a control unit.

9. The control device of claim 1, wherein optical detection module includes at least one light source and at least two photodetectors.

10. The control device of claim 1, wherein the optical detection module includes a first circuit board configured to detect position of the rack with phototransistors and a second circuit board configured to provide a light source.

11. The control device of claim 10, wherein the first and second circuit boards are arranged on opposite sides of the rack.

12. The control device of claim 1, wherein the optical detection module includes a control unit configured to control and disable operation of the drive element.

13. A control console comprising:
    a plurality of control devices;
    a memory; and
    a processor coupled to the plurality of control devices and memory, the processor configured to output one or more signals to one or more of the control devices,
    wherein each control device includes
    an electrically conductive linear guide;
    a slider unit having a slider connected to the linear guide, a control knob and a contact tab coupled to the control knob, the contact tab being electrically connected to the linear guide, the slider unit being moveable linearly along the linear guide;
    a rack connected at a first portion to the slider and being moveable linearly with the slider unit relative to the linear guide to linearly displace the slider, the rack comprising a plurality of slots;
    a control unit coupled to the processor and having a control circuit electrically coupled to the linear guide and configured to receive an electrical signal from the contact tab through the linear guide;
    a drive system with a drive element connected to a second portion of the rack spaced apart from the first portion, the drive element being in a fixed position relative to the linear guide, the drive element being operably coupled to the control circuit and activatable to linearly to displace the rack to move the slots and position the control knob relative to the linear guide; and
    an optical detection module in a fixed position relative to the linear guide and spaced apart from the first portion of the rack, the optical detection module being connected to the control unit and configured to detect linear movement of the rack and a position of the control knob based on one or more optical signals detected relative to slots of the rack.

14. The control console of claim 13, wherein the linear guide includes at least one rod supporting the slider for linear displacement along the at least one rod.

15. The control console of claim 13, wherein the control knob includes the contact tab configured to detect user touch.

16. The control console of claim 13, wherein the control knob includes a wiper connected to the linear guide and configured to electrically couple the contact tab to the control circuit through the linear guide based on user contact with the control knob.

17. The control console of claim 13, wherein slots of the rack are equally sized and are employed by the optical detection module to provide a linear encoder based on displacement of the rack.

18. The control console of claim 13, wherein the drive system comprises a motor connected to the drive element is coupled to a motor and relates to a drive wheel in contact with the rack.

19. The control console of claim 13, wherein each control device further comprises a spring clip configured to maintain the drive element in contact with the rack.

20. The control console of claim 13, wherein drive element is configured to control position of the control knob based on one or more control signals received from the processor.

21. The control console of claim 13, wherein the optical detection module includes at least one light source and at least two photodetectors.

22. The control console of claim 13, wherein the optical detection module includes a first circuit board configured to detect position of the rack with phototransistors and a second circuit board configured to provide a light source.

23. The control console of claim 22, wherein the first and second circuit boards are arranged on opposite sides of the rack.

24. The control console of claim 13, wherein the optical detection module includes a control unit configured to control and disable operation of the drive element.

25. A control device, comprising:
an electrically conductive linear guide;
a slider unit having a slider connected to the linear guide, a control knob coupled to the slider, and a contact tab coupled to the control knob, the contact tab being electrically connected to the linear guide, the slider unit being moveable linearly along the linear guide;
a rack connected to an end portion of the slider unit and being moveable linearly with the slider unit relative to the linear guide to linearly displace the slider unit, the rack comprising a plurality of slots;
a mount module adjacent to an end portion of the linear guide, the rack and slider unit being moveable relative to the mount module
a control circuit connected to the mount-module and electrically coupled to the linear guide and configured to receive an electrical signal from the contact tab through the linear guide;
a drive system connected to the mount module adjacent to the end portion of the linear guide, the drive system having a motor and a drive wheel operably connected to the motor, the drive wheel being urged into engagement with the rack and being rotatable to move the rack and slider unit linearly relative to the linear guide;
an optical detection module connected to the mount module in a fixed position relative to the linear guide and spaced apart from the end portion of the rack, the optical detection module being connected to the control circuit and configured to detect linear movement of the rack and a position of the control knob based on one or more optical signals detected relative to slots of the rack.

* * * * *